United States Patent
Jansson (10) Patent No.: US 6,972,701 B2
(45) Date of Patent: Dec. 6, 2005

(54) A/D CONVERTER CALIBRATION

(75) Inventor: Christer Jansson, Linköping (SE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/950,271

(22) Filed: Sep. 24, 2004

(65) Prior Publication Data

US 2005/0057379 A1    Mar. 17, 2005

Related U.S. Application Data

(63) Continuation of application No. PCT/SE03/00449, filed on Mar. 17, 2003.

(30) Foreign Application Priority Data

Mar. 25, 2002 (SE) .................................. 0200940

(51) Int. Cl.[7] .................. H03M 1/10; H03M 1/62; H03M 1/84; H03M 1/88
(52) U.S. Cl. ............................ 341/120; 341/139
(58) Field of Search .............. 341/118, 120, 161, 341/165, 74, 121, 139

(56) References Cited

U.S. PATENT DOCUMENTS

| | | | | |
|---|---|---|---|---|
| 4,272,760 A | * | 6/1981 | Prazak et al. ............... | 341/120 |
| 4,908,621 A | * | 3/1990 | Polonio et al. ............. | 341/120 |
| 5,012,181 A | * | 4/1991 | Eccleston ................... | 324/74 |
| 5,121,117 A | | 6/1992 | Rabii | |
| 5,272,481 A | * | 12/1993 | Sauer ........................ | 341/165 |
| 5,990,814 A | | 11/1999 | Croman et al. | |
| 6,489,905 B1 | * | 12/2002 | Lee et al. .................... | 341/120 |
| 6,556,154 B1 | * | 4/2003 | Gorecki et al. ............. | 341/118 |
| 6,624,772 B1 | * | 9/2003 | Gealow et al. ............. | 341/120 |
| 6,642,869 B2 | * | 11/2003 | Kuyel et al. ................ | 341/120 |
| 6,778,110 B2 | * | 8/2004 | Jansson ...................... | 341/120 |
| 6,781,531 B2 | * | 8/2004 | Ostrom et al. .............. | 341/120 |
| 6,822,601 B1 | * | 11/2004 | Liu et al. .................... | 341/161 |
| 6,897,794 B2 | * | 5/2005 | Kuyel et al. ................ | 341/120 |

FOREIGN PATENT DOCUMENTS

CA         2092666         10/1994

* cited by examiner

Primary Examiner—Patrick Wamsley
(74) Attorney, Agent, or Firm—Baker Botts L.L.P.

(57) ABSTRACT

A D/A converter range calibration system in an A/D converter structure including a set of comparators with associated calibrating D/A converters includes means (RCC) for determining the offset error range for the entire set of comparators and means (R-DAC) for adjusting the dynamic range of each calibrating D/A converter to this offset error range.

16 Claims, 12 Drawing Sheets

A/D CONVERTER CALIBRATION

CROSS REFERENCE TO RELATED APPLICATION

This application is a continuation of copending International Application No. PCT/SE03/00449 filed Mar. 17, 2003 which designates the United States, and claims priority to Swedish application no. 0200940-5 filed Mar. 25, 2002.

TECHNICAL FIELD OF THE INVENTION

The present invention relates to A/D (analog-to-digital) converters, and in particular how to improve the accuracy and yield of flash A/D converters or A/D sub-converters in pipeline, sub-ranging and cyclic A/D converters.

BACKGROUND OF THE INVENTION

The maximum achievable accuracy-speed performance of any A/D converter is limited by non-ideal effects associated with its building blocks. Typically, the performance is limited by settling time, limited amplifier gain and component mismatch. When designing high performance A/D converters, these limitations impose stringent demands on building blocks, leading to prolonged design time, lower yield and trade-offs between accuracy and speed.

Calibration techniques to relax the demands of the A/D converter components are useful. However, the largest error amplitude that the calibration has to cope with may not be well known or vary strongly between different converters of the same type. This leads to a need for large calibration ranges to guarantee that all errors can be covered by the calibration. In some circumstances this will lead to an undesirable amount of extra chip area and resolution of calibrating D/A (digital-to-analog) converters. Additionally, the implemented resolution of the calibrating D/A converters will not be fully utilized in cases where the actual error amplitudes are substantially less than the implemented calibration range.

SUMMARY OF THE INVENTION

An object of the present invention is to improve the utilization of the calibrating D/A converter resolution in flash type A/D converters or sub-converters to increase the overall A/D converter accuracy and to guarantee that no errors supersede the calibrating D/A converter range.

This object can be achieved by a method of improving accuracy of an A/D converter structure including a set of comparators with associated calibrating D/A converters, comprising the steps of determining a measure of the offset error range for the entire set of comparators; and adjusting the dynamic range of each calibrating D/A converter to the determined measure.

The method may further comprise the step of distributing the dynamic range symmetrically around zero output. The method may alternatively comprise the step of distributing the dynamic range asymmetrically around zero output. The method may further comprising the step of performing range calibration in background simultaneously with offset calibration.

The object can also be achieved by a D/A converter range calibration system in an A/D converter structure including a set of comparators with associated calibrating D/A converters, comprising means for determining a measure of the offset error range for the entire set of comparators; and means for adjusting the dynamic range of each calibrating D/A converter to the determined measure.

The object can furthermore be achieved by a D/A converter range calibration system in an A/D converter structure comprising a set of comparators with associated calibrating D/A converters, a control unit for determining a measure of the offset error range for the entire set of comparators; and a range D/A converter for adjusting the dynamic range of each calibrating D/A converter to the determined measure.

The system may comprise means for distributing the dynamic range symmetrically around zero output. The system may alternatively comprise means for distributing the dynamic range asymmetrically around zero output. The system may comprise means for performing range calibration in background simultaneously with offset calibration.

Briefly, the present invention determines the offset error range for the entire set of comparators and thereafter adjusts the dynamic range of each calibrating D/A converter to the determined offset error range. This maximizes utilization of the resolution of the calibrating D/A converters.

The invention is applicable to many A/D conversion structures, such as: flash; sub-ranging; multi-bit delta-sigma; and pipeline A/D converters. Systems requiring such A/D converters can be found in, for example, base stations for wide-band digital radio systems such as WCDMA, GSM, UTMS.

BRIEF DESCRIPTION OF THE DRAWINGS

The invention, together with further objects and advantages thereof, may best be understood by making reference to the following description taken together with the accompanying drawings, in which.

DETAILED DESCRIPTION OF THE INVENTION

In the following description the same reference designations will be used for the same or similar elements.

In this disclosure, a pipeline A/D converter will be used to illustrate the proposed range calibration method, but the method can also be applied to other types of converters, such as flash, sub-ranging, multi-bit delta-sigma and cyclic A/D converters or whenever a larger number of parallel offset calibrated comparators are used.

Figure 1:
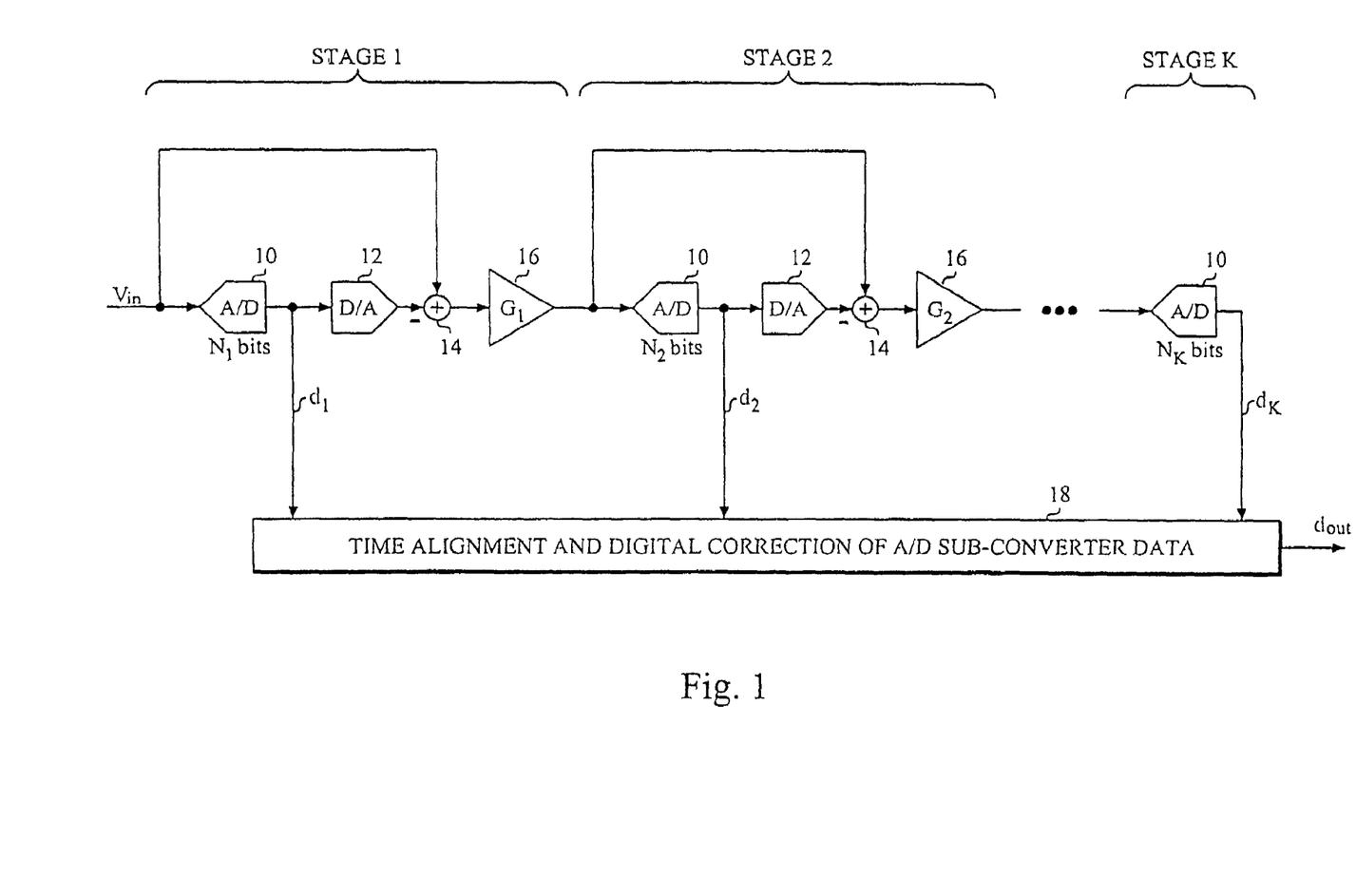
FIG. 1 is a block diagram of a typical pipeline A/D converter.

FIG. 1 is a block diagram of a typical pipeline A/D converter. An N-bit analog-to-digital conversion is performed in two or more stages, each stage extracting $\{N_1, N_2 \ldots N_k\}$ bits of information represented by the digital words $\{d_1, d_2 \ldots d_k\}$, where K is the number of pipeline stages. The first pipeline stage extracts the $N_1$ most significant bits using an $N_1$-bit A/D sub-converter 10. Then the estimated value is subtracted from the analog input signal $V_{in}$ by using a D/A sub-converter 12 and an adder 14, leaving a residue containing the information necessary to extract less significant bits. Usually the residue is amplified by an amplifier 16 having a gain $G_1$ to establish the appropriate signal range for stage 2. These steps are repeated for all K stages, with the exception of the last pipeline stage, which does not need to produce an analog output and therefore has no D/A converter, adder or amplifier, but only an A/D converter 10. The digital words $\{d_1, d_2 \ldots d_k\}$ are then combined to form the digital output word $d_{out}$ in a unit 18 for time alignment and digital correction of A/D sub-converter data.

In order to simplify the following description, it is assumed that an A/D converter stage has a resolution of 3 bits. This number is sufficiently small to be manageable, but is also large enough to illustrate the essential features of a typical case. However, it is appreciated that in general the number of bits may be larger. This is especially the case for a single-stage flash A/D converter, which typically may have a resolution of up to 10 bits.

Figure 2:
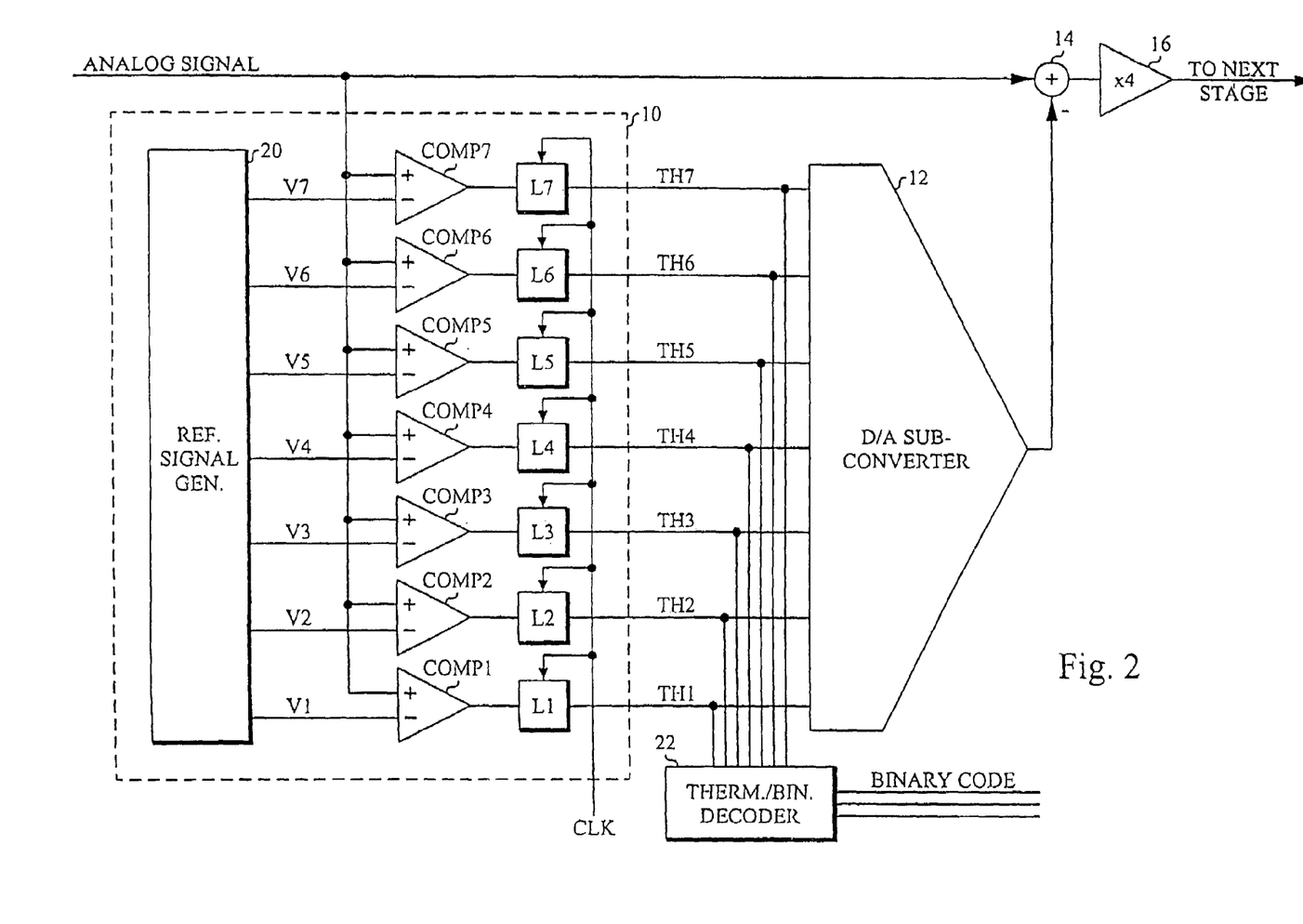
FIG. 2 is a block diagram of a typical stage of the A/D converter in FIG. 1.

FIG. 2 is a block diagram of a typical stage of the A/D converter in FIG. 1. A/D sub-converter 10 includes a number of comparators COMP1 . . . COMP7. One input terminal of each comparator is connected to a corresponding reference or threshold voltage V1 . . . V7. These reference voltages are formed by a reference signal generator 20. The other input terminal of each comparator receives the analog input signal (the same signal to each comparator). The output signals from the comparators collectively form the digitized value in thermometer code. These signals are latched in latches L1 . . . L7 and forwarded to D/A sub-converter 12 over a thermometer code bus TH1 . . . TH7, where they are transformed into a corresponding analog value in D/A sub-converter 12. This value is subtracted from the original analog value in adder 14, and the residual signal is amplified by a gain equal to 4 in gain element 16. The thermometer code is also converted to binary code in element 22.

Figure 3:
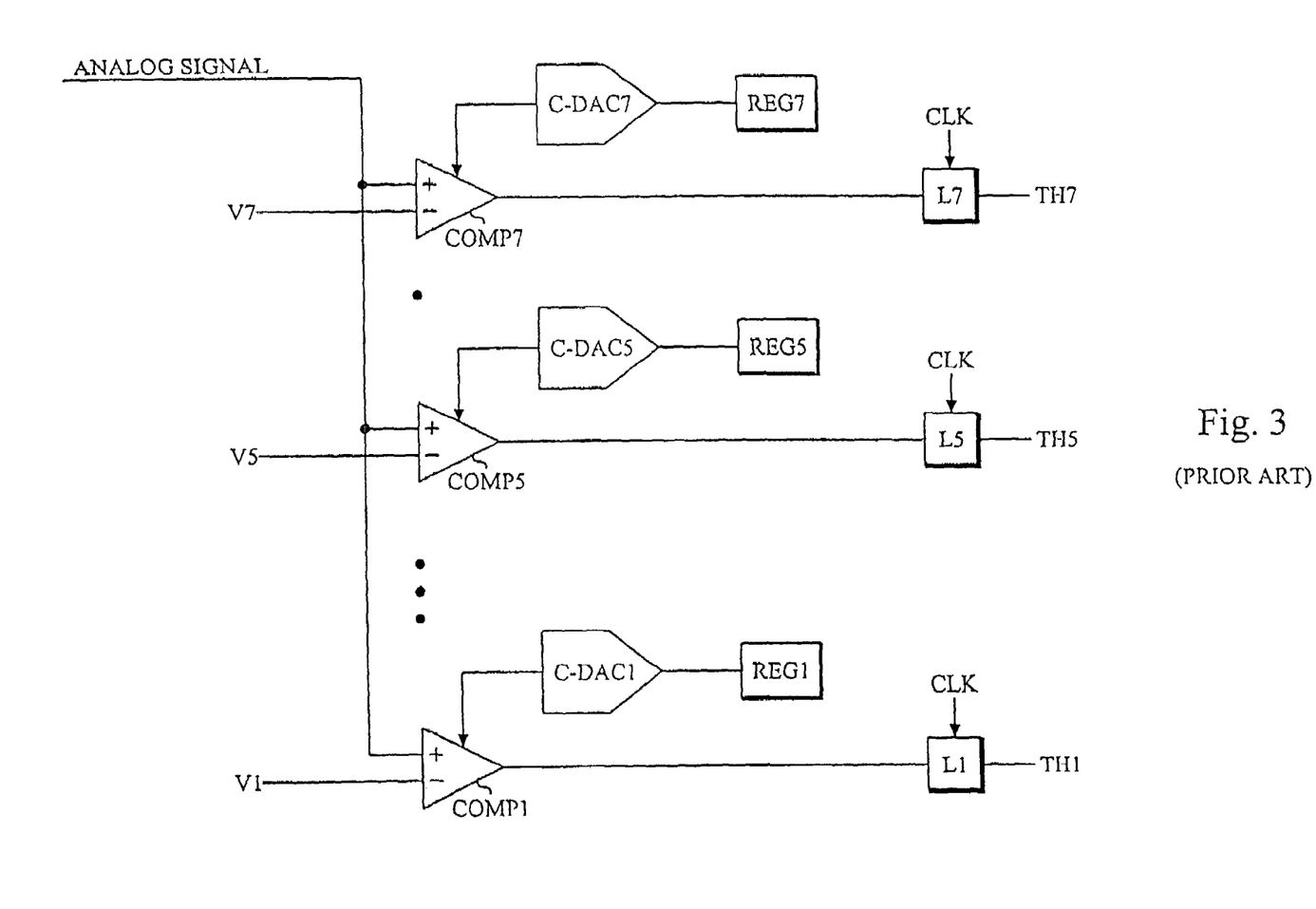
FIG. 3 is a block diagram of a typical prior art calibrated comparator stage.

FIG. 3 is a block diagram of a typical prior art offset calibrated comparator stage. In this and the following figures some of the comparators (and their corresponding calibrating elements) have been indicated by dots to increase readability of the drawings. The trip-points of comparators COMP1 . . . COMP7 are adjusted (to compensate for comparator offset) by individual calibrating D/A converters C-DAC1 . . . C-DAC7, which receive calibration values from corresponding registers REG1 . . . REG7. A problem with this prior art arrangement is that the largest offset error amplitude that the calibration has to cope with may not be well known or vary strongly between different A/D converters of the same type. This leads to a need for large calibration ranges to guarantee that all offset errors can be covered by the calibration. In some circumstances this will lead to an undesirable amount of extra chip area and resolution of the calibrating D/A converters. Additionally, the implemented resolution of the calibrating D/A converters will not be fully utilized in cases where the actual offset error amplitudes are substantially less than the implemented calibration range.

Figure 4:
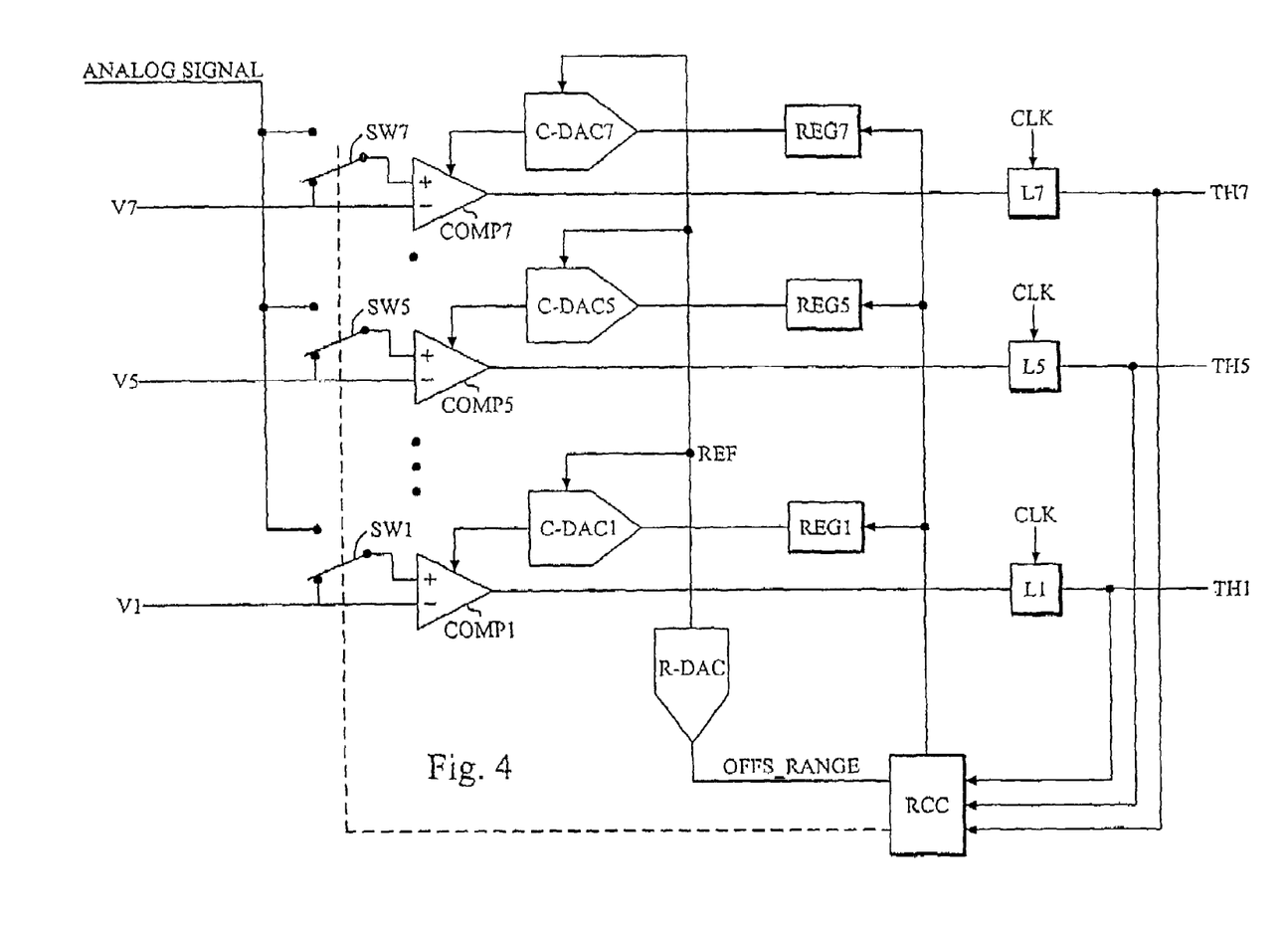
FIG. 4 is a block diagram illustrating the principles of an offset range calibrated comparator stage in accordance with the present invention.

FIG. 4 is a block diagram illustrating the principles of an offset range calibrated comparator stage in accordance with the present invention. According to the invention the calibration range of each calibrating D/A converter C-DAC1 . . . C-DAC7 is adjusted by a range D/A converter R-DAC, which is controlled by a range calibration control unit RCC. During range calibration, control unit RCC connects both inputs of each comparator to the corresponding reference voltage V1 . . . V7 using switches SW1 . . . SW7. In this way the comparator offsets will determine the comparator output states, either 0 or 1. Control unit RCC then forwards a set of common calibration values to all registers REG1 . . . REG7 to force all comparators to make a transition from 0 to 1 and vice versa. Simultaneously it determines the minimum calibration range OFFS_RANGE required to cover all comparator offsets (this will be described in detail below). Each calibrating D/A converter will thus be adjusted to have this required offset calibration range, thereby fully utilizing the calibrating D/A converter resolution.

Since larger groups of calibrating D/A converters may be served by one range D/A converter, the amount of extra hardware including extra calibration logic for the range D/A converter can still be manageable. One such group may be the calibrating D/A converters of an A/D sub-converter in a pipeline A/D converter or all calibrating D/A converters on a chip, depending on the specific application.

An exemplary embodiment of the range calibration apparatus in accordance with the present invention will now be described with reference to FIG. 5–8.

Figure 5:
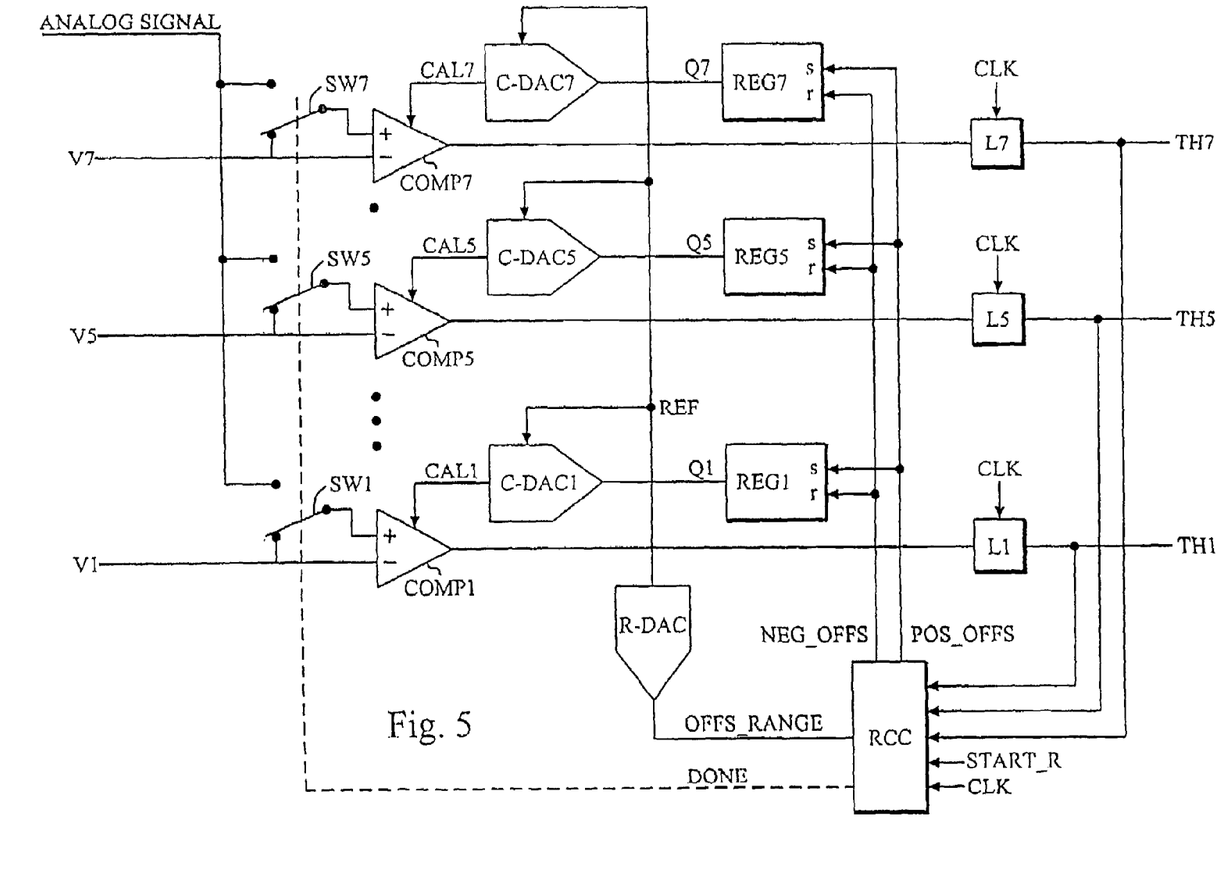
FIG. 5 is a block diagram of an exemplary embodiment of an offset range calibrated comparator stage in accordance with the present invention.
Figure 12:
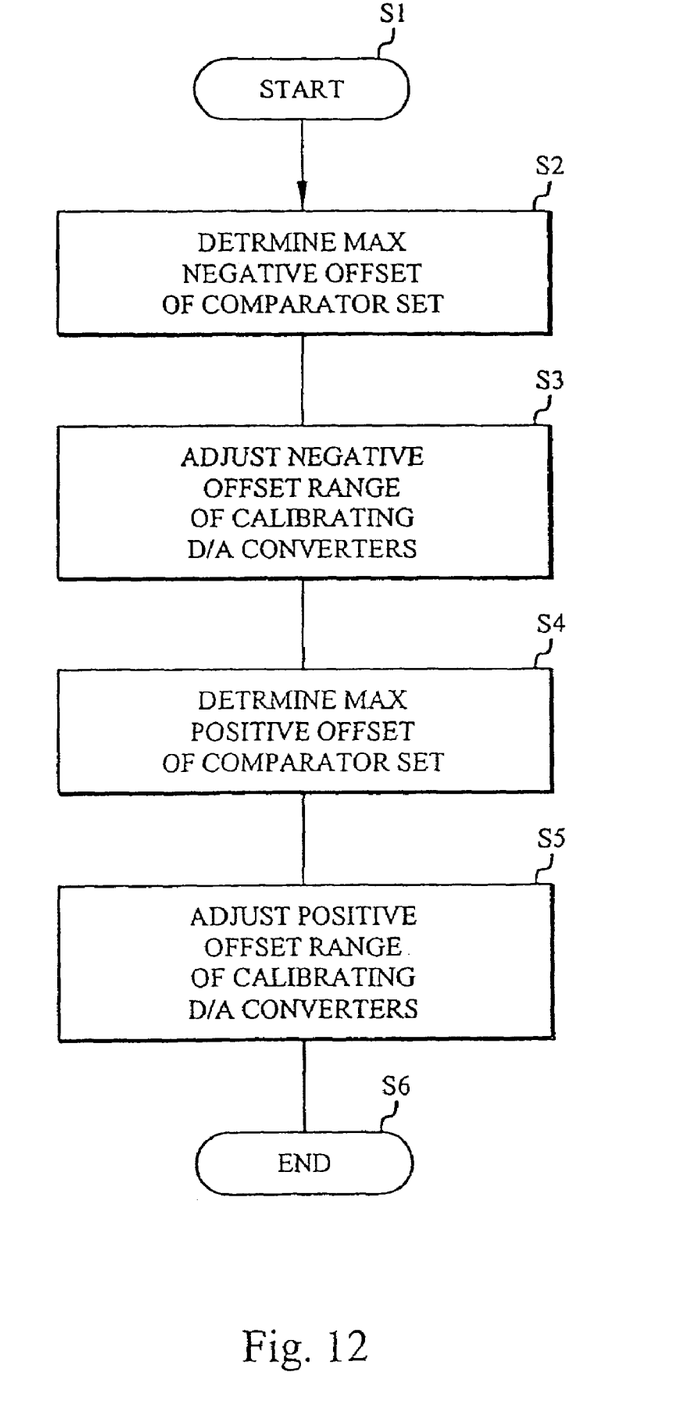
FIG. 12 is a flow chart illustrating the offset range calibration method in accordance with the present invention.

FIG. 5 is a block diagram of an exemplary embodiment of an offset calibrated comparator stage in accordance with the present invention. This embodiment includes a group of comparators COMP1 . . . COMP7 using differential calibrating D/A converters C-DAC1 . . . C-DAC7 to remove the comparator offsets. The comparator array could for example be a flash A/D converter or an A/D sub-converter in a pipeline, sub-ranging, cyclic, or delta-sigma A/D converter. The differential calibrating D/A converters are here assumed to have a symmetrical swing around zero output with no possibility to customize negative and positive ranges independently. The general idea of this embodiment is to step up the range D/A converter R-DAC from its minimum value to a value where all the calibrating D/A converters maximum values just override all the comparator offsets. To achieve this, the range step-up is divided into two step-up phases: one to check the most positive offset and one to check the most negative offset. In this specific implementation as shown in the flow chart in FIG. 12 the maximally negative offset is tested first, but the order is irrelevant and may be interchanged. Steps S1 through S6 show the respective steps which can be changed in their order as indicated above. The step-up and testing is controlled by the range calibration control unit RCC, which is expanded in FIG. 6. In turn, the RCC contains an adequate range test unit ART which is used to indicate either all high (ONES) or all low (ZEROS) states on the comparator output bus (thermometer code bus) TH1 . . . TH7.

Figure 6:
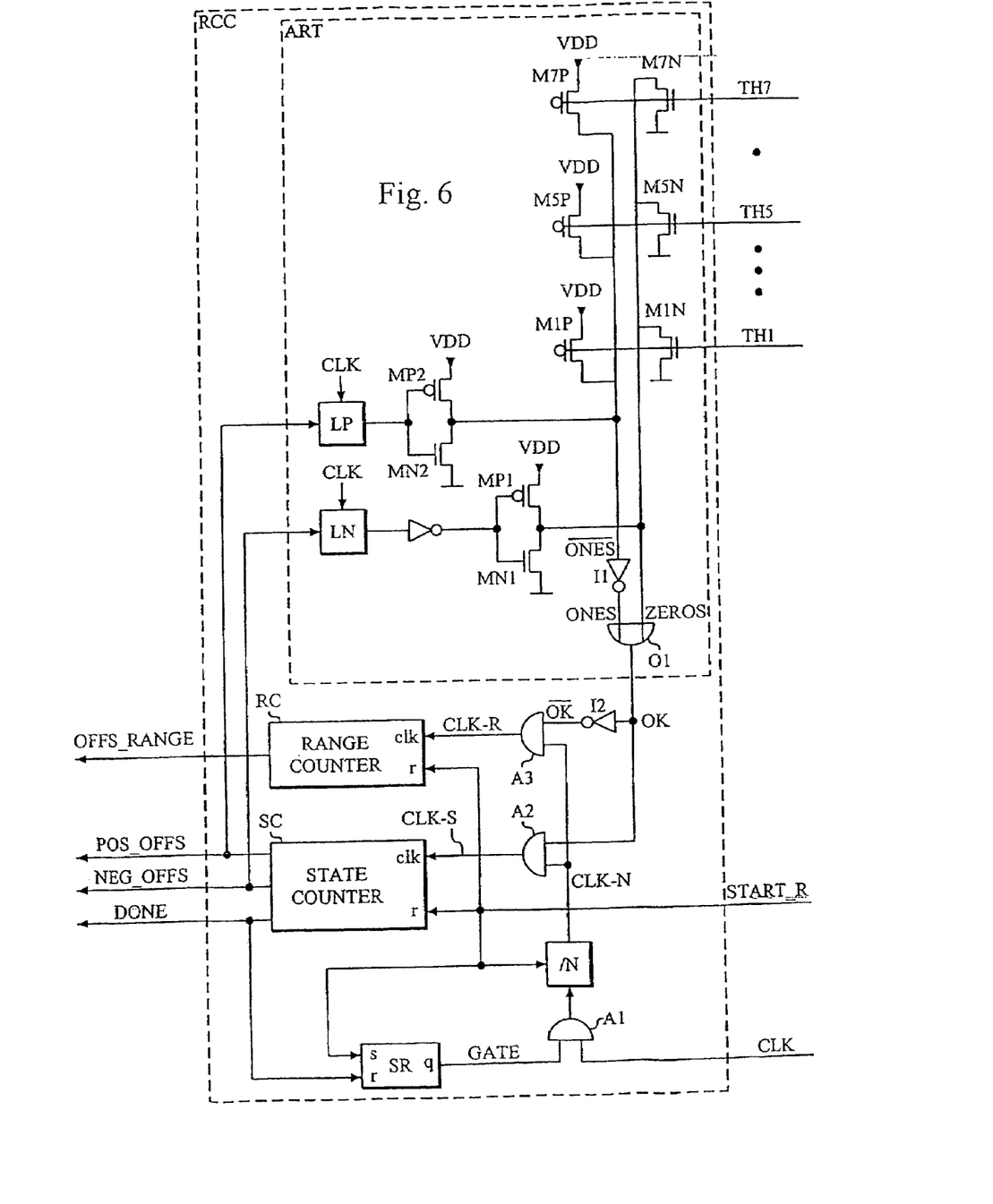
FIG. 6 is a block diagram of a range calibration control unit used in the embodiment of FIG. 5.
Figure 7:
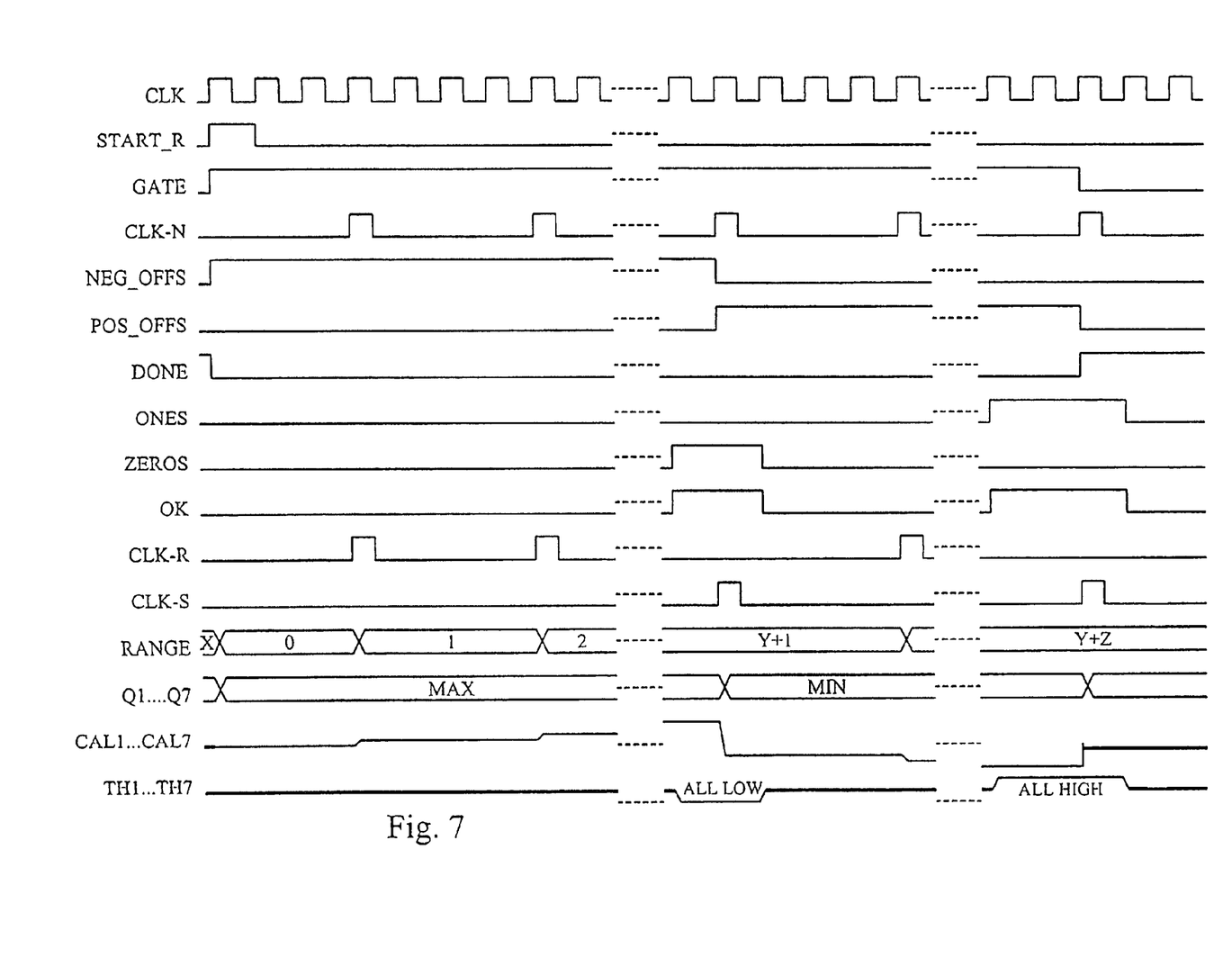
FIG. 7 is a timing diagram illustrating different signals in the range calibration control unit of FIG. 6.

The timing diagram in FIG. 7 illustrates the signals of the embodiment of FIG. 5–6 during an offset calibration period and is provided to support the detailed description below.

A range calibration is initiated by a high START_R signal that asynchronously resets range and state counters RC, SC and a clock divider indicated by element/N in FIG. 6 to zero. This sets the range signal OFFS_RANGE to a minimum value and the NEG_OFFS state signal to high, while both the POS_OFFS and DONE signals will be set low. The START_R signal also sets the GATE signal high through the set-reset latch SR, which will allow the CLK signal to pass through the AND gate A1 and reach the clock divider/N. The CLK-N signal will now be high during every $N^{th}$ clock pulse. The division ratio N has to be chosen large enough to ensure that the range D/A converter R-DAC and all calibrating D/A converters have time to settle to satisfactory accuracy and the corresponding outputs have time to propagate through the comparators and the succeeding latches.

The low DONE signal also forces the comparator positive inputs to disconnect from the analog input signal and instead connect to the reference in-puts V1 . . . V7 so that all comparators get a zero differential input voltage. The zero input voltages make the comparators respond to only their offset voltages and the applied calibration voltages CAL1 . . . CAL7. The calibration control signals belonging to the normally used calibration method are overridden by the high NEG_OFFS signal and this sets outputs Q1 . . . Q7 of registers REG1 . . . REG7 to the minimum value. As a consequence, the calibration output voltages CAL1 . . . CAL7 of calibrating D/A converters C-DAC1 . . . C-DAC7 will be set to their maximally negative amplitude, where this amplitude value is determined by the reference REF delivered by the range D/A converter R-DAC. The reference REF may be single-ended or differential, depending on implementation.

Since the range D/A converter R-DAC in the settled initial state generates the lowest possible REF value, it is likely that the calibrating voltages CAL1 . . . CAL7 will not be able to override all of the negative offsets of the comparator array and therefore some comparator outputs will still be high. Here negative offset is defined as the negative voltage that has to be applied to the normal comparator input to reach the comparator threshold. The comparator output will therefore be high until a sufficiently large compensation voltage has been applied. Positive offsets are defined similarly. In case of high comparator outputs one or more of the nMOS transistors M1N . . . M7N in FIG. 6 will conduct and pull the signal ZEROS low. Since POS_OFFS is low, the transistor MP2 will conduct and hold the signal ONES high. Both inputs to OR gate O1 will be low, since the ONES signal is inverted in an inverter I1 and therefore the OK signal will also be low. Since the OK signal is inverted by an inverter I2 before it is forwarded to AND gate A3, the CLK-N signals will be passed on to the CLK-R signal, which will step up range counter RC and hence the REF signal. At the same time the low OK signal blocks the CLK-N signal from passing AND gate A2, which maintains NEG_OFFS signal high. This will continue until REF has increased to a level where the calibrating D/A converter outputs CAL1 . . . CAL7 become negative enough to counteract the most negative offset of the comparator array. When this happens, none of transistor M1N . . . M7N will conduct so that the weaker pull-up pMOS transistor MP1 will be able to draw the signal ZEROS high. As a consequence, the OK and OK signals will be high and low respectively, thereby blocking the CLK-N pulse to the CLK-R signal but instead passing the CLK-N pulse to the CLK-S signal. This will change the NEG_OFFS and POS_OFFS signals to low and high, respectively, which means that the calibration range will be tested against positive offsets instead.

During the initial phase of positive offset testing the range counter is kept at the final value obtained from the negative offset testing. The calibration control signals will again be overridden, but the signals Q1 . . . Q7 will this time be reset to their highest value. The calibrating D/A converters will therefore be set to the most positive calibration signal CAL1 . . . CAL7 that they can produce, given the current REF value. In case the calibrating D/A converter range, after the range step-up during the check of the negative offsets, is sufficiently large to counteract the most positive offset of the comparator array, then all comparator outputs will be high. If so, none of transistors M1P . . . M7P will conduct and the ONES signal will be pulled down by the weak transistor MN2, which will be on since the POS_OFFS signal is high. The ZEROS signal will be low since NEG_OFFS is low, which keeps transistor MN1 conducting and transistor MP1 non-conducting. Thus, the high ONES signal produces a high OK signal. In case the calibrating D/A converter range is not sufficiently large to counteract the most positive offset of the comparator array, then one or more of the comparator outputs will be low.

This means that the corresponding transistors M1P . . . M7P will conduct and force the ONES signal high, leading to a low OK signal. As during the check of the negative offsets, the low OK signal will pass on clock pulses to the CLK-R signal, which will step up the range until all comparator offsets are overridden and a high OK signal is obtained.

The now high OK signal blocks the CLK-N signal from reaching CLK-R and no further range step-up will be made. Instead, the CLK-N signal is passed on to CLK-S, which puts the state counter into the final DONE state, so that the POS_OFFS signal and the DONE signal change to low and high, respectively. The high DONE signal alters the GATE signal to low in SR, which blocks the CLK signal and puts the range calibration circuitry into a stable condition. The POS_OFFS and NEG_OFFS signals will now both be low, which enables normal operation of the registers REG1 . . . REG7 by the normal control signals, so that the comparator offset calibration may take place. Also, the high DONE signal allows the comparator inputs to connect to their normal connections to obtain normal comparator operation. The ZEROS and ONES nodes will be held at ground and VDD potential by MN1 and MP2, respectively, which will prevent static current consumption in transistors M1N . . . M7N and M1P . . . M7P.

Figure 8:
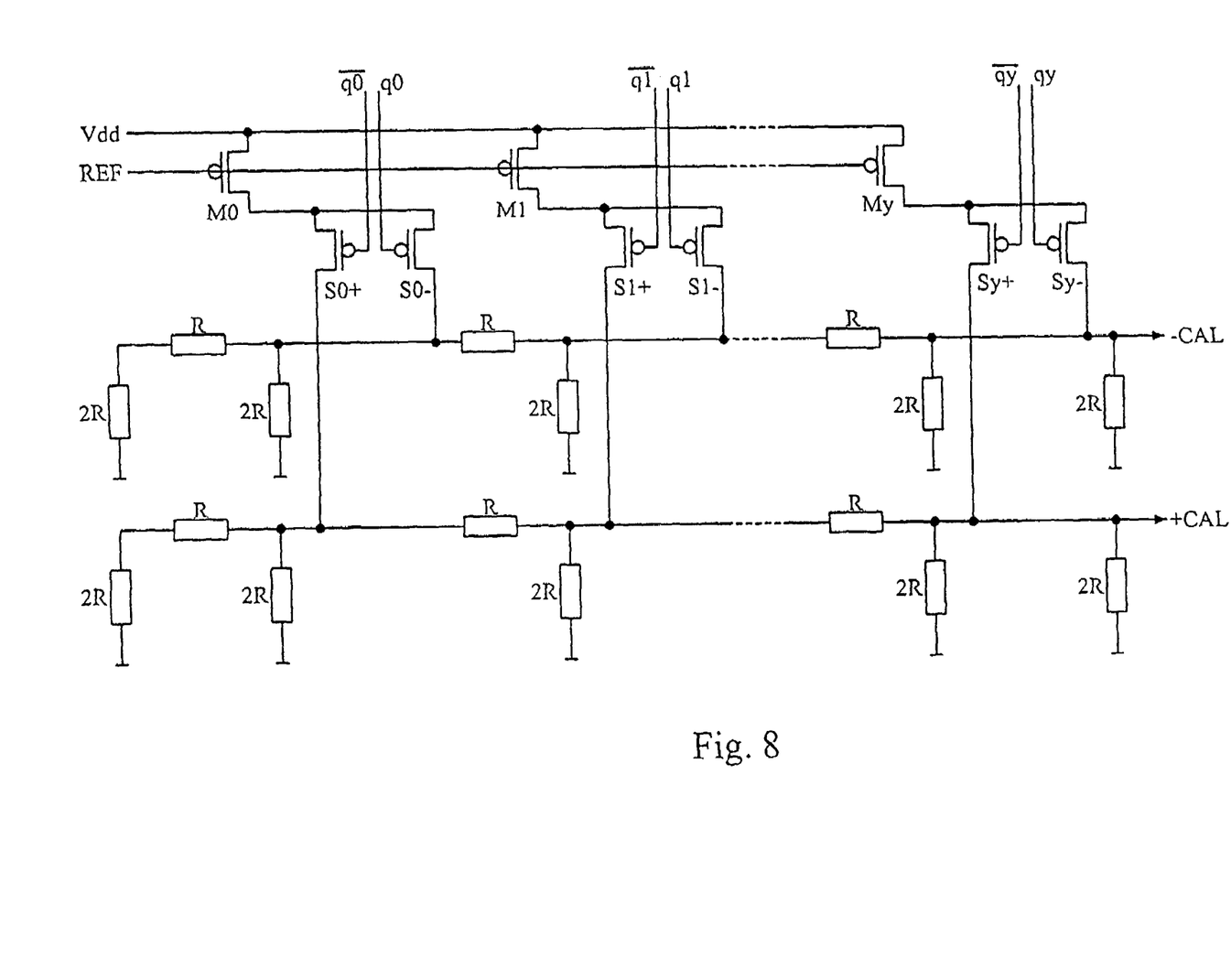
FIG. 8 illustrates a calibrating D/A converter with symmetrical output swing that may be used in the range calibration control unit of FIG. 6.

An example of a calibrating D/A converter with a symmetrical swing that can be used in this embodiment is illustrated in FIG. 8. The input calibration data word q0 . . . qy switches the currents created by the applied REF biasing of transistors M0 . . . My in switches S0+ . . . Sy+, S0− . . . Sy− to either of the +CAL or −CAL branches. Since the circuit is symmetrical the output swing will also be symmetrical.

Figure 9:
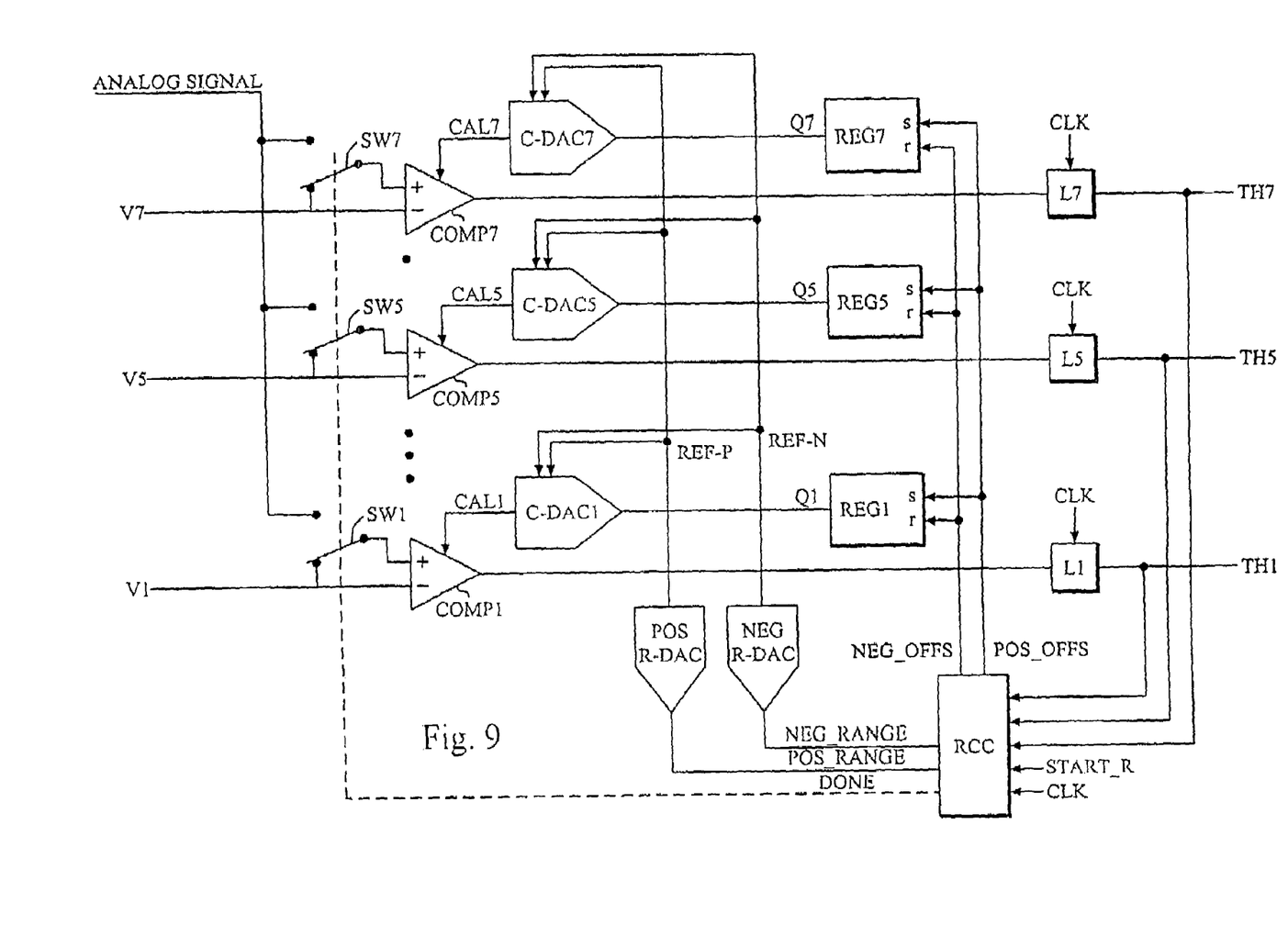
FIG. 9 is a block diagram of another exemplary embodiment of an offset range calibrated comparator stage in accordance with the present invention.
Figure 10:
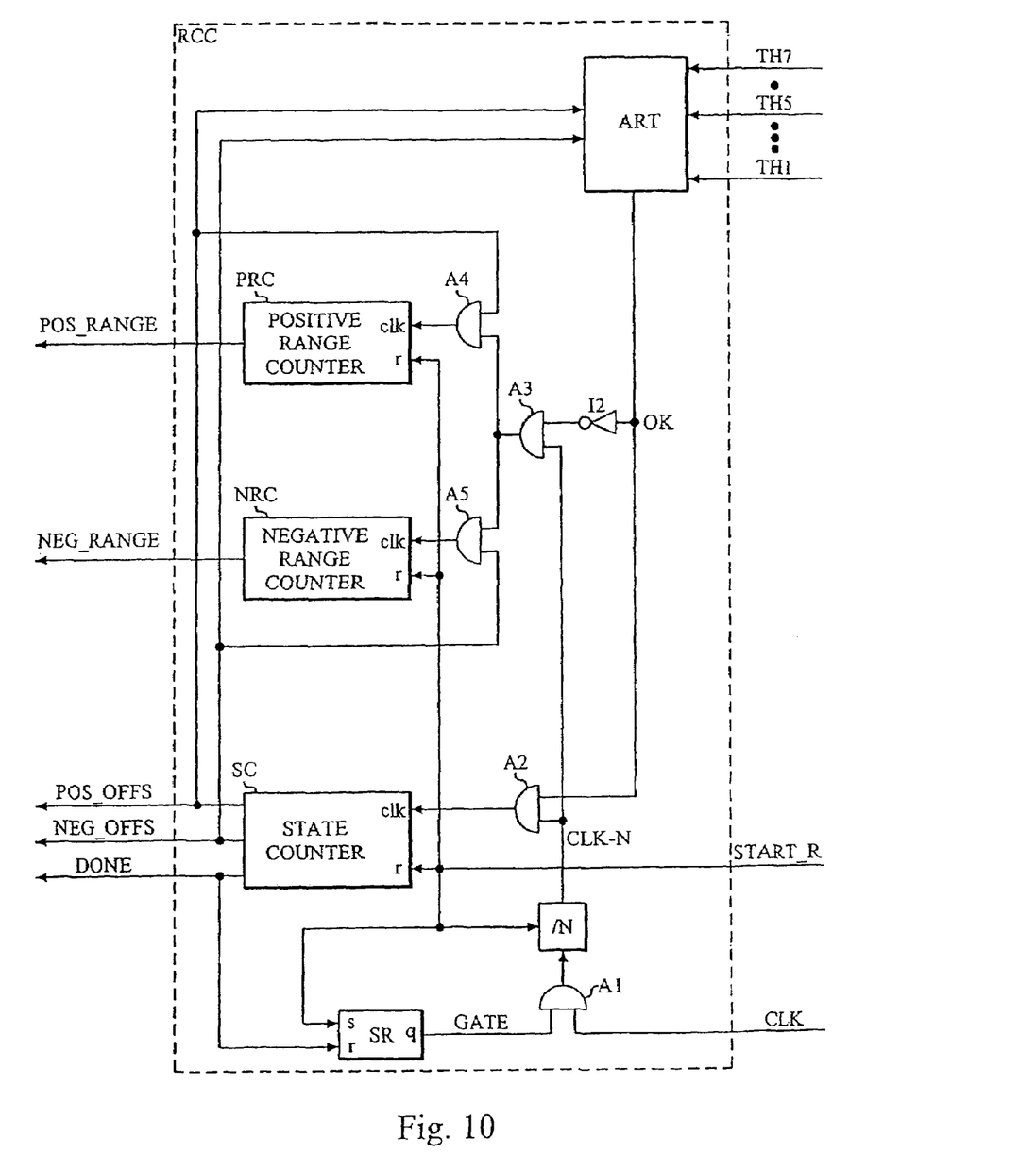
FIG. 10 is a block diagram of a range calibration control unit used in the embodiment of FIG. 9.
Figure 11:
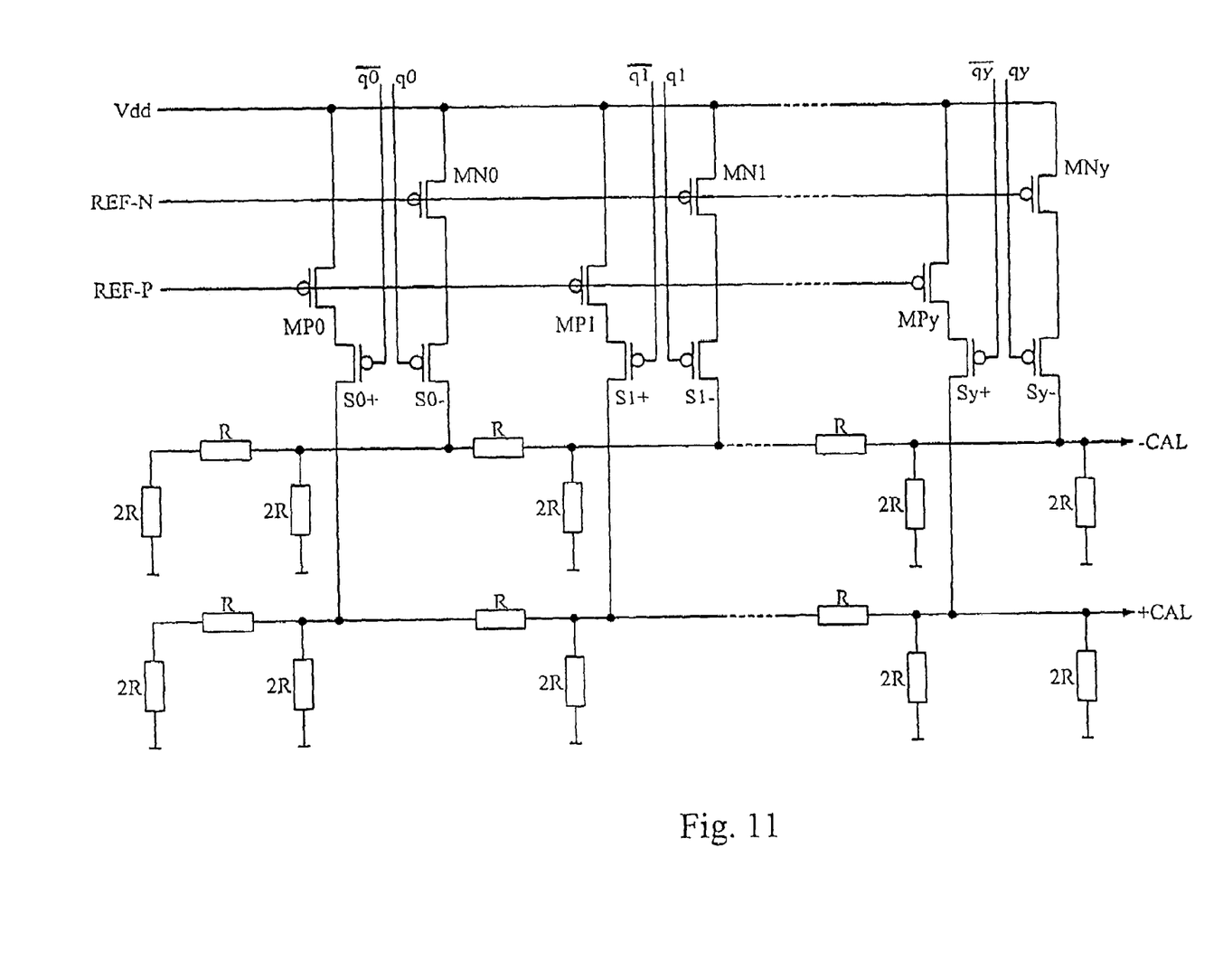
FIG. 11 illustrates a calibrating D/A converter with asymmetrical output swing that may be used in the range calibration control unit of FIG. 10.

An embodiment of the present invention with asymmetrical range calibration is illustrated in FIG. 9–11. The advantage of asymmetrical range calibration is that the calibration range can be maximally utilized when the largest positive and negative offsets are different (in the symmetrical case the calibration range will be at least twice the largest offset amplitude). This embodiment is quite similar to the first embodiment, except that there are two range counters PRC, NRC and a positive and negative range D/A converter R-DAC. The modified range calibration control unit RCC is shown in FIG. 10. The clock signals from AND gate A3 to positive and negative range counters PRC, NRC are additionally controlled by the POS_OFFS and NEG_OFFS signals over AND gates A4 and A5, respectively. This separates the negative range calibration from the positive range calibration. The operation is nearly identical to the first embodiment, except that in the negative offset testing phase the negative range counter NRC is incremented from its lowest state until the negative offsets are counteracted and similarly the positive range counter PRC is incremented from its lowest state during the separate positive offset testing phase until the positive offsets are counteracted.

This second embodiment is possible if the upper and lower output limits of the calibrating D/A converters can be set separately as illustrated by the calibrating D/A converter in FIG. 11. The topology is still symmetrical, but the electrical biasing can be made asymmetrical, since there are now dedicated bias transistors MP0 . . . MPy, MN0 . . . MNy for each switch S0+ . . . Sy+, S0− . . . Sy−, which allows upper and lower ranges to be set independently with REF-P and REF-N, respectively.

The range calibration method described so far separates the offset calibration from the range calibration. An alternative method is to operate the range calibration in background simultaneously with the offset calibration. The idea is to increment the calibration range one level when a calibration word to any calibrating D/A converter has reached an upper threshold value, preferably its maximum amplitude, and to decrease the calibration range one step when the largest calibration word of all calibrating D/A converters has gone below a certain threshold, for example half the maximum amplitude. A suitable calibration method for pipeline and sub-ranging A/D converters is described, for example, in [1]. Possibly, an initial range calibration can be performed at start-up as previously described if there is a need for a rapid operation of the A/D converter after start-up which calls for a minimum settling time.

In the description above the offset error range was defined only by the actual offset errors. However, it is also feasible to add a safety margin to the actually determined range, for example to cope with component drift and disturbances.

It will be understood by those skilled in the art that various modifications and changes may be made to the present invention without departure from the scope thereof, which is defined by the appended claims.

REFERENCE

[1] Zhiqiang Gu and W. Martin Snelgrove, "A Novel Self-Calibrating Scheme for Video-Rate 2-Step Flash Analog-to-Digital Converter," IEEE International Symposium on Circuits and Systems, Vol. 4, pp. 601–604, New York, N.Y., USA, 1992.

I claim:

1. A method of improving accuracy of an A/D converter structure including a set of comparators with associated calibrating D/A converters for providing individual offset voltages and a range D/A converter for providing a common gain control voltage, comprising the steps of:
   providing each comparator with a predefined reference voltage;
   providing each calibrating D/A converter with a common calibration value;
   determining a minimum calibration range value for said range D/A converter to cover a gain control common to all comparators; and
   adjusting the individual offset of each comparator by adjusting the associated calibrating D/A converter.

2. The method of claim 1, comprising the step of distributing said dynamic range symmetrically around zero output.

3. The method of claim 1, comprising the step of distributing said dynamic range asymmetrically around zero output.

4. The method of claim 1, wherein the step of providing each comparator with a predefined reference voltage includes the step of providing each input of a comparator with the same reference voltage.

5. A D/A converter range calibration system in an A/D converter structure, comprising:
   a plurality of comparators each comprising a calibration input coupled with an associated calibrating D/A converter;
   a plurality of calibration registers each coupled with an associated calibrating D/A converter;
   a range D/A converter coupled with said associated calibrating D/A converters;
   a range register coupled with said range D/A converter;
   control means for determining a range gain control value to be stored in said range register for the entire set of comparators.

6. The system of claim 5, wherein each calibrating D/A converter is a differential calibrating D/A converter.

7. The system of claim 6, wherein the range D/A converter comprises positive range D/A converter and a negative range D/A converter.

8. The system of claim 6, wherein each calibration register can be forced to output a maximum or minimum value.

9. A D/A converter range calibration system in an A/D converter structure comprising:
   a set of comparators with associated calibrating D/A converters,
   a control unit for determining an gain control value common to the entire set of comparators; and
   a range D/A converter for adjusting each calibrating D/A converter by the determined gain control value.

10. The system of claim 9, wherein each calibrating D/A converter is a differential calibrating D/A converter.

11. The system of claim 10, wherein the range D/A converter comprises positive range D/A converter and a negative range D/A converter.

12. The system of claim 9, comprising said control unit adjusts the dynamic range of each comparator symmetrically around zero output by adjusting said associated calibrating D/A converters.

13. A method of improving accuracy of an A/D converter structure including a set of comparators with associated differential calibrating D/A converters for providing individual differential offset voltages and a differential range D/A converter for providing a common differential gain control voltage, comprising the steps of:
   providing each comparator with a predefined reference voltage;
   providing each calibrating D/A converter with a first calibration value;
   determining a first calibration range value for said range D/A converter to cover a first gain control common to all comparators;
   providing each calibrating D/A converter with a second calibration value;
   determining a second calibration range value for said range D/A converter to cover a second gain control common to all comparators; and adjusting the individual offset of each comparator by adjusting the differential associated calibrating D/A converter.

14. The method according to claim 13, wherein the first calibration value is a minimum value and the second calibration value is a maximum value.

15. The method according to claim 13, wherein first calibration range offset is provided by a negative range D/A converter and the second calibration range offset is provided by a positive range D/A converter.

16. The method according to claim 13, wherein the step of providing each comparator with a predefined reference value includes the step of providing each input of a comparator with the same reference value.

* * * * *